(12) United States Patent
Planche et al.

(10) Patent No.: US 10,901,740 B2
(45) Date of Patent: Jan. 26, 2021

(54) SYNTHETIC DEPTH IMAGE GENERATION FROM CAD DATA USING GENERATIVE ADVERSARIAL NEURAL NETWORKS FOR ENHANCEMENT

(71) Applicant: Siemens Aktiengesellschaft, Munich (DE)

(72) Inventors: Benjamin Planche, Munich (DE); Ziyan Wu, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/636,674

(22) PCT Filed: Aug. 7, 2018

(86) PCT No.: PCT/US2018/045464
§ 371 (c)(1),
(2) Date: Feb. 5, 2020

(87) PCT Pub. No.: WO2019/032481
PCT Pub. Date: Feb. 14, 2019

(65) Prior Publication Data
US 2020/0167161 A1 May 28, 2020

Related U.S. Application Data

(60) Provisional application No. 62/542,474, filed on Aug. 8, 2017.

(51) Int. Cl.
*G06F 9/32* (2018.01)
*G06T 7/50* (2017.01)
(Continued)

(52) U.S. Cl.
CPC .............. *G06F 9/328* (2013.01); *G06F 30/10* (2020.01); *G06N 3/08* (2013.01); *G06T 7/50* (2017.01); *G06T 2207/20182* (2013.01)

(58) Field of Classification Search
None
See application file for complete search history.

(56) References Cited

U.S. PATENT DOCUMENTS

2017/0161590 A1* 6/2017 Boulkenafed ........ G06K 9/6215
2018/0314917 A1* 11/2018 Mehr ................... G06K 9/6274
(Continued)

FOREIGN PATENT DOCUMENTS

WO 2018080533 A1 5/2018
WO 2018156126 A1 8/2018

OTHER PUBLICATIONS

Garcia-Garcia, Alberto, et al. "Pointnet: A 3d convolutional neural network for real-time object class recognition." 2016 International Joint Conference on Neural Networks (IJCNN). IEEE, 2016.*
(Continued)

*Primary Examiner* — Ryan M Gray

(57) ABSTRACT

A system and method for generating realistic depth images by enhancing simulated images rendered from a 3D model, include a rendering engine configured to render noiseless 2.5D images by rendering various poses with respect to a target 3D CAD model, a noise transfer engine configured to apply realistic noise to the noiseless 2.5D images, and a background transfer engine configured to add pseudo-realistic scenedependent backgrounds to the noiseless 2.5D images. The noise transfer engine is configured to learn noise transfer based on a mapping, by a first generative adversarial network (GAN), of the noiseless 2.5D images to real 2.5D scans generated by a targeted sensor. The background transfer engine is configured to learn background generation based on a processing, by a second GAN, of output data of the first GAN as input data and corresponding real 2.5D scans as target data.

15 Claims, 6 Drawing Sheets

(51) Int. Cl.
  *G06F 30/10*  (2020.01)
  *G06N 3/08*  (2006.01)

(56) References Cited

U.S. PATENT DOCUMENTS

2018/0330511 A1* 11/2018 Ha ................. G06K 9/6247
2020/0285907 A1* 9/2020 Mehr ............... G06K 9/6274

OTHER PUBLICATIONS

Gschwandtner, Michael, et al. "BlenSor: blender sensor simulation toolbox." Advances in visual computing (2011): 199-208.
Landau, Michael J., Benjamin Y. Choo, and Peter A. Beling. "Simulating kinect infrared and depth images." IEEE Transactions on Cybernetics 46.12 (2016): 3018-3031.
Planche, Benjamin, et al. "DepthSynth: Real-Time Realistic Synthetic Data Generation from CAD Models for 2.5 D Recognition." arXiv preprint arXiv:1702.08558 (2017).
Ronneberger, Olaf, Philipp Fischer, and Thomas Brox. "U-net: Convolutional networks for biomedical image segmentation." International Conference on Medical Image Computing and Computer-Assisted Intervention. Springer International Publishing, 2015.
Hinterstoisser, Stefan, et al. "Model based training, detection and pose estimation of texture-less 3d objects in heavily cluttered scenes." Asian conference on computer vision. Springer Berlin Heidelberg, 2012.
Isola, Phillip, et al. "Image-to-image translation with conditional adversarial networks." arXiv preprint arXiv:1611.07004 (2016).
Radford, Alec, Luke Metz, and Soumith Chintala. "Unsupervised representation learning with deep convolutional generative adversarial networks." arXiv preprint arXiv:1511.06434 (2016).
International Search Report dated Oct. 12, 2018; International Application No. PCT/US2018/045464; 10 pages.
Goodfellow, Ian J. et al. "Generative adversarial nets" Advances in Neural Information Processing Systems, arXiv:1406.2661; 2014.
Ian Goodfellow: "NIPS 2016 Tutorial: Generative Adversarial Networks", Cornell University Library—arXiv.org e-Print archive, Apr. 3, 2017 (Apr. 3, 2017), pp. 1-55, XP002785140.

* cited by examiner

SYNTHETIC DEPTH IMAGE GENERATION FROM CAD DATA USING GENERATIVE ADVERSARIAL NEURAL NETWORKS FOR ENHANCEMENT

TECHNICAL FIELD

This application relates to artificial intelligence. More particularly, this application relates to applying artificial intelligence to image generation.

BACKGROUND

Recent progress in computer vision applications, such as recognition and reconstruction, has been dominated by deep neural networks trained with large amounts of accurately labeled data. For example, trained neural networks can be used to process a given image input and recognize objects in the image. Identification of objects in an image has a multitude of applications. However, training for the neural networks requires collecting and annotating vast datasets with labels, which is a tedious, and in some contexts, impossible task. Typical training datasets require around 10,000 images at minimum to obtain desired accuracy for object recognition. There is considerable effort needed to obtain more than 10,000 images using sensor devices, and to include annotation information such as capture pose on each image. Some approaches for generating training data rely solely on synthetically rendered data from 3D models using 3D rendering engines. Results for such methods have been inadequate due to the discrepancies between the synthetic scans and I scans obtained by sensor devices. In particular, synthetic scans are based on clean renderings, and lack noise and backgrounds found in scans produced by actual sensors. As a result, such synthetic scans cannot properly train the neural networks to recognize objects during runtime when analyzing sensor scans.

Previous works tried to statistically simulate and apply noise impairment to depth images. Such simulation-based pipelines have difficulties reproducing the scan quality of real devices in some particular conditions. For example, some sensors include unknown post-processing and image enhancement processing. Other causes for failure to accurately simulate real scans include gaps between the simulation engine and the real-world environment, such as ambient illumination, surface material, certain optical effects, etc.

SUMMARY

Aspects according to embodiments of the present disclosure include a process and a system to generate realistic depth images by enhancing simulated images rendered from a 3D model. A rendering engine is provided to render noiseless 2.5D images by rendering various poses with respect to a target 3D CAD model. A noise transfer engine is provided to apply realistic noise to the noiseless 2.5D images, and a background transfer engine is provided to add pseudo-realistic scene-dependent backgrounds to the noiseless 2.5D images. Training of the noise transfer engine includes learning noise transfer based on a mapping, by a first generative adversarial network (GAN), of the noiseless 2.5D images to real 2.5D scans generated by a targeted sensor. Training of the background transfer engine includes learning background generation based on a processing, by a second GAN, of output data of the first GAN as input data and corresponding real 2.5D scans as target data The advantage of the trained neural network pipeline according to the embodiments of the disclosure is to generate a very large number of realistic depth images from simulated images based on 3D CAD models. Such depth images are useful to train an application-specific analytic model, without relying on access to large amounts of real image data from sensors, which is difficult to obtain and annotate precisely.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Methods and systems are disclosed for enhanced depth image generation from synthetic depth images that simulate depth scans of an object by an image sensor. Machine learning by neural networks is used to extract simulated sensor noise from actual sensor scans, which may be transferred onto simulated depth renderings. Another set of neural networks may be trained to extract simulated background information from a training dataset, which may also be transferred onto the simulated depth renderings. Application of trained neural networks of a formed pipeline in accordance with embodiments of this disclosure include processing 3D CAD model images, rendering simulated depth images, transferring realistic noise and background information onto the simulated depth images, and thereby generating realistic depth images. The resultant realistic depth images may be useful as training data for learning by neural networks of application-specific analytic models, such as a computer vision algorithms related to object recognition. Unlike conventional depth-based object recognition systems that attempt to rely solely on simulated training data, the realistic depth images generated according to the present disclosure provide superior training data to object recognition systems leading to more accurate object recognition.

Figure 1:
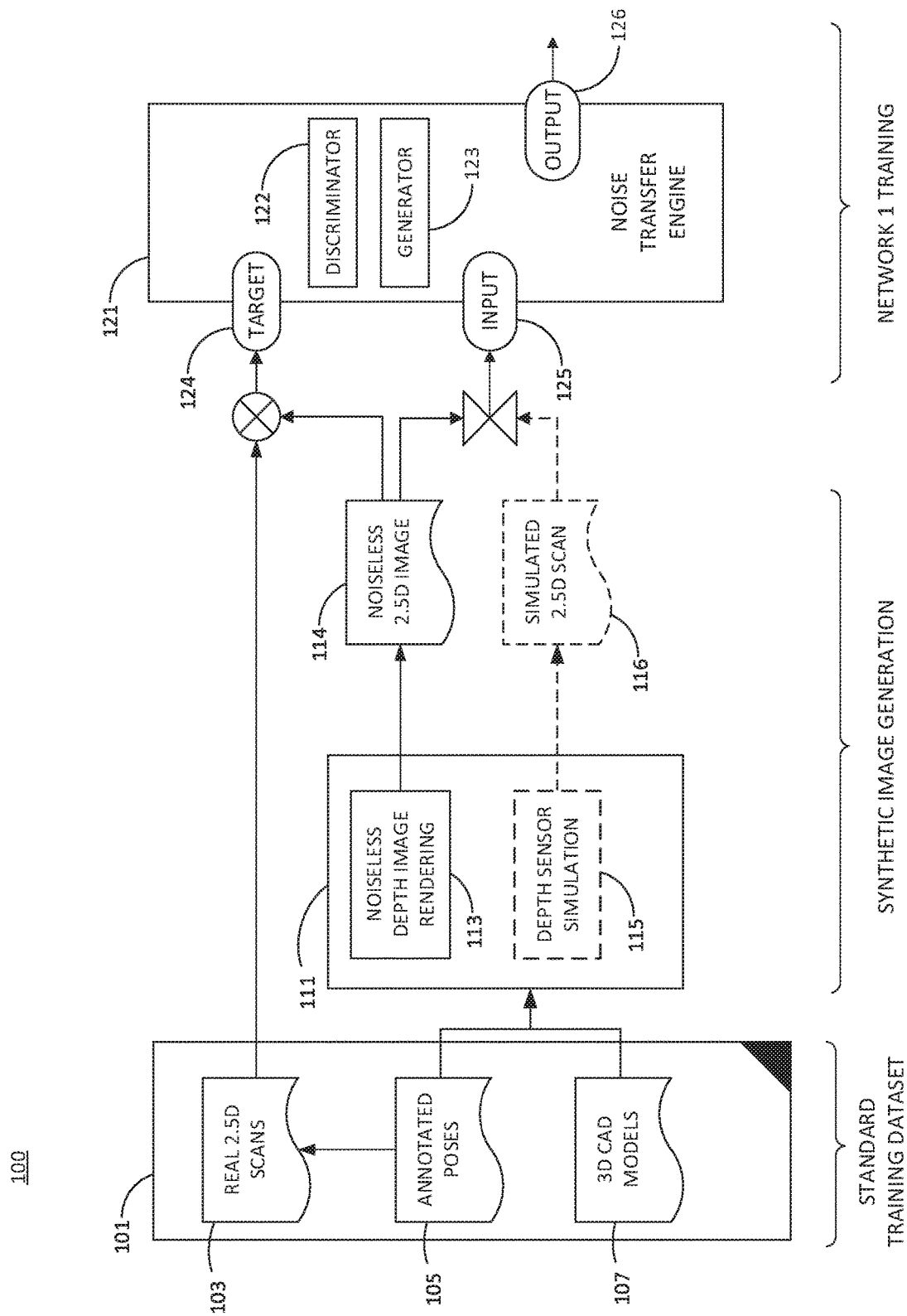
FIG. 1 shows a flow diagram for an example of learning noise transfer by a first generative adversarial neural network in accordance with one or more embodiments of the disclosure.

FIG. 1 shows a flow diagram for an example of learning noise transfer by a first generative adversarial neural network in accordance with one or more embodiments of the disclosure. The visual recognition system of the present disclosure may apply neural networks, such as deep generative adversarial networks (GANs), which may learn noise components related to depth sensors. In an embodiment, a learning process 100 is configured to generate training data for a noise transfer engine. To initialize the learning of the neural networks, a standard training data set is generated by a tagged process at stage 101. Given a set of objects for the visual recognition learning, a 3D CAD model 107 for each object or for each set of objects may be provided, such as engineering design renderings of an object or a system of components. From the 3D CAD models 107, synthetic images may be generated by rendering engine 111, rendered as noiseless 2.5D images 114. For each 3D CAD model 107, multiple synthetic images may be rendered corresponding to various annotated poses 105 (e.g., simulated depth images from a virtual depth sensor). The noiseless 2.5D images 114 have no background information since the 3D CAD models are generated as clean images, unlike scanned images captured by sensors. Real 2.5D scans 103 may be captured by one or more actual sensors that are to be simulated, with the scans corresponding to the objects rendered by the 3D CAD model 107. By training with a small number of images from a particular sensor type, the learned model becomes sensor-specific, but not application or object specific. Hence, realistic depth scans can be achieved a model trained with real 2.5D scans from as few as one sensor type. Backgrounds may be cropped from the real 2.5D scans 103 using the noiseless 2.5D image 114 rendered as a mask. This allows a target image to represent the target object more clearly without the presence of background information acting as noise. The input of the noise transfer engine 121 may include the noiseless 2.5D image 114.

In an embodiment, a depth sensor simulation engine 115 may additionally generate input data as a simulated 2.5D depth scan 116, representing a pseudo-realistic depth image for the object, without background information, by using the same 3D CAD model 107 and annotated pose data 105 as for generation of the noiseless 2.5D image 114. As an example, for each shot, two generated images, the noiseless 2.5D image 114 and the pseudo-realistic scan 116 may be stacked (e.g., collated) into a single image, such as a 2-channel depth image and received as an input 125 for the noise transfer engine 121. Of the 2-channel image, the noise-free channel provides clean depth information about the pictured scene to the network 121, while the channel already containing simulated noise helps the network 121 converge faster and more efficiently.

The noise transfer engine 121 may be configured as an image-to-image GAN architecture with a discriminator neural network 122 and a generator neural network 123. In an embodiment, the discriminator neural network 122 may be configured as a deep convolutional network with Leaky ReLUs and sigmoid activation for output. At each iteration of training, the discriminator network 122 may take as input 125 the original synthetic image and either the target 124 real one ("real" pair) or the enhanced output 126 from the generator ("fake" pair), stacked into a single image, using the latest state of the generator. The discriminator network 122 functionality includes discernment of "fake" pairs from "real" pairs, in which the activation layer represent deductions, each activation representing a prediction for a patch of the input data. A binary cross entropy loss function may be applied by the discriminator network 122. In an embodiment, the generator neural network 123 may be configured as a U-Net architecture, with the synthetic depth data as input, and an activation layer returning an enhanced image. In order to train the generator 123 to force the simulated input data similar to the real target data and to fool the discriminator 122, the loss function for the generator 123 may be a combination of a cross entropy evaluation of the output and target images, and the reversed discriminator loss. Once converged, the weights of the GAN of noise transfer engine 121 are fixed and saved. Both the discriminator network 122 and the generator network 123 may be configured to process multi-channel depth images (e.g., 16 bpp). While examples are described above for implementing a discriminator neural network 122 and a generator neural network 123, other variations may be used to implement the noise transfer engine 121.

Figure 2:
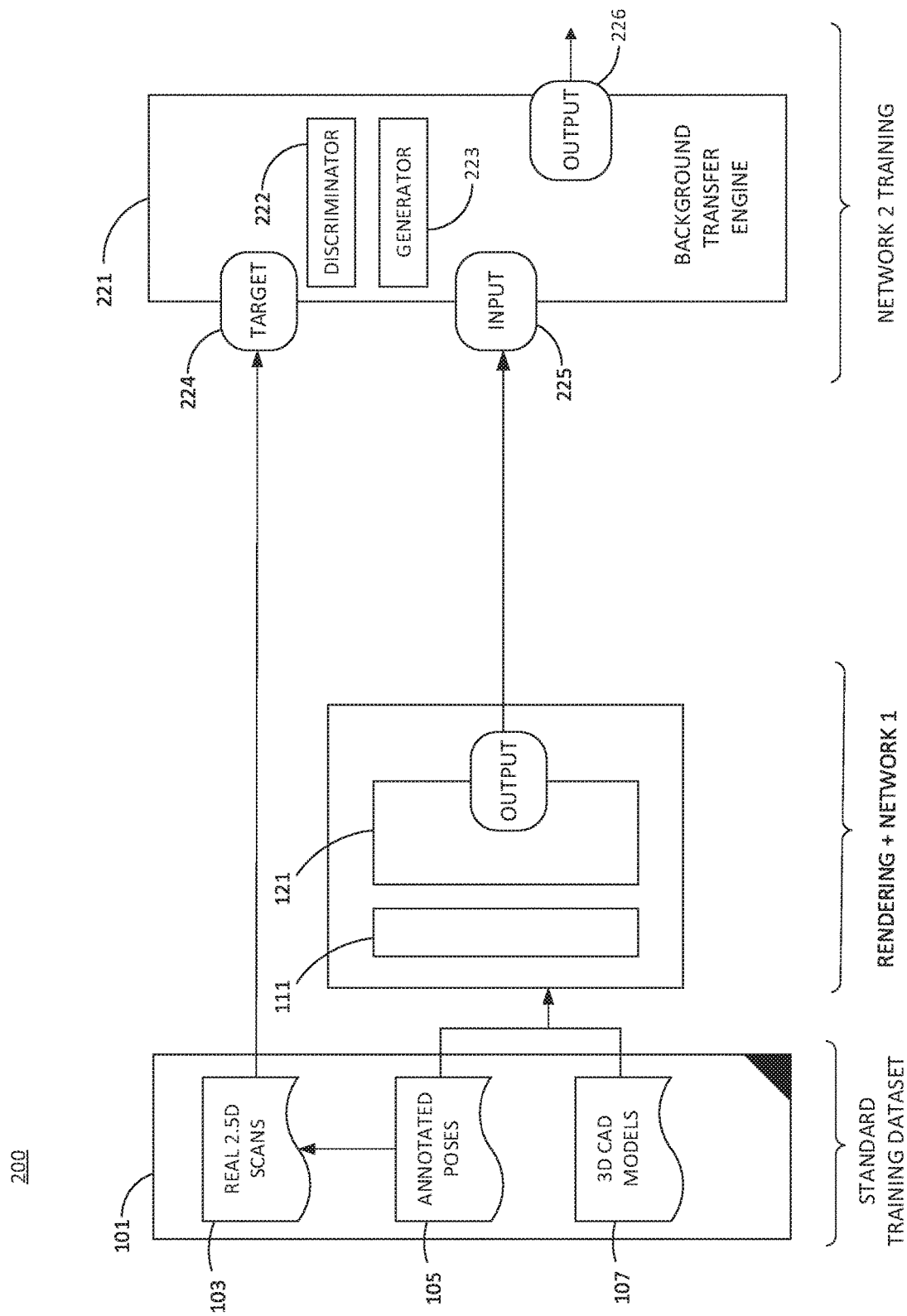
FIG. 2 shows a flow diagram for an example of learning background transfer by a second generative adversarial neural network in accordance with one or more embodiments of the disclosure.

FIG. 2 shows a flow diagram for an example of learning background transfer by a second generative adversarial neural network in accordance with one or more embodiments of the disclosure. In an embodiment, a learning process 200 is configured to generate training data for neural networks of a background transfer engine 221. Unlike the neural networks of noise transfer engine 121, which is trained to learn to reproduce the generic noise of a chosen depth sensor, the background transfer engine 221 learns to grasp the complex, contextual distribution of the background environment for the chosen training dataset. The simulated backgrounds to be applied to the given images once trained will thus be similar to those of the training dataset.

To initialize the learning of the GAN of background transfer engine 221, the same standard training data set as used for training of the noise transfer engine 121, is generated by a tagged process at stage 101. Given a set of objects for the visual recognition learning, a 3D CAD model 107 for each object may be provided, such as engineering design renderings of an object or a system of components. From the 3D CAD models 307, synthetic images may be generated by rendering engine 111, and processed by the trained noise transfer engine 121, for input of the GAN of background transfer engine 221. Real depth scans 103 with annotated poses 105 are received as target data for the GAN of background transfer engine 221. Unlike the training of the noise transfer engine 121, in which the backgrounds were removed from the real scans 103, the learning by the background transfer engine is made possible by using target images data that include the background. The corresponding input images output from the noise transfer engine 121 are single channel pseudo realistic images enhanced by the GAN of the noise transfer engine 121.

The background transfer engine 221 may be configured as an image-to-image GAN architecture with a discriminator neural network 222 and a generator neural network 223. In an embodiment, the discriminator network 222 may be configured similarly to the discriminator network 122. The generator network 223 may be configured with the same architecture as the generator network 123, but with a loss function that may be edited to heavily penalize changes to image foreground by using input data as a binary mask and a Hadamard product. At each iteration of training, the discriminator network 222 may take the enhanced output of noise transfer engine 121 as input 225, and either the real scan 103 as the target 224 (i.e., the "real" pair) or the enhanced output 226 from the generator 223 (i.e., the "fake" pair), stacked into a single image, using the latest state of the generator 223. The discriminator network 222 functionality includes discernment of "fake" pairs from "real" pairs, in which the activation layer represent deductions, each activation representing a prediction for a patch of the input data. A binary cross entropy loss function may be applied by the discriminator network 222. In an embodiment, the generator neural network 223 may be configured as a U-Net architecture, with the synthetic depth data from noise transfer engine 121 as input 225, and an activation layer returning an enhanced image as output 226. In order to train the generator 223 to force the simulated input data similar to the real target data and to fool the discriminator 222, the loss function for the generator 223 may be a combination of a cross entropy evaluation of the output and target images, and the reversed discriminator loss. Once converged, the weights of the GAN of background transfer engine 221 may be fixed and saved, which completes the training of the entire pipeline for depth image generation useful for visual recognition applications. Following training, should the proposed pipeline be applied to a sensibly different environment, such as a new target domain, the background transfer engine 221 may be fine-tuned by a refinement tuning session over a small dataset of real images 103 from the new target domain, to generate additional background data as required.

Figure 3:
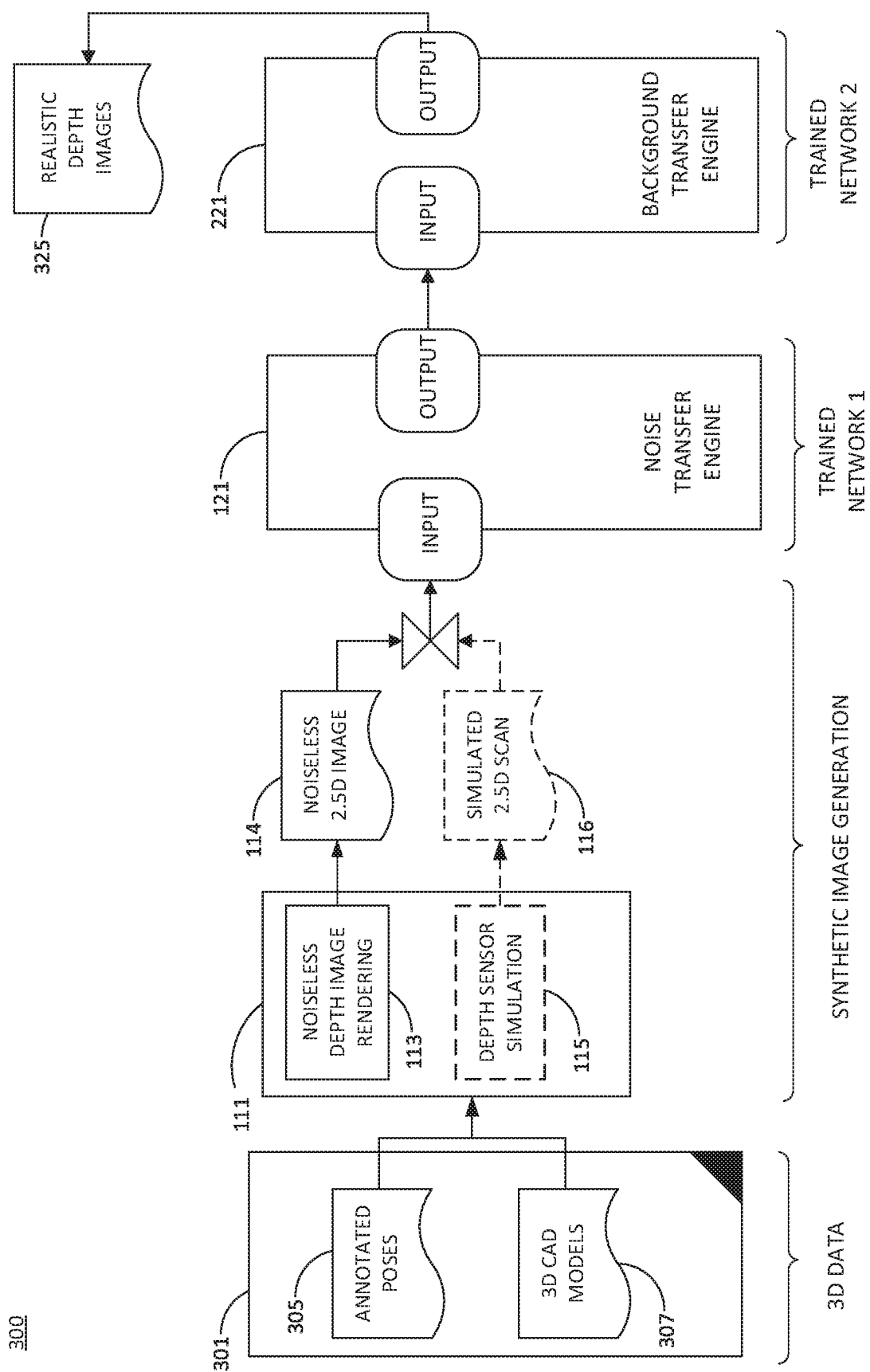
FIG. 3 is a flow diagram for an example of a pipeline using the networks of FIG. 1 and FIG. 2 for generating realistic depth images from a 3D model.

FIG. 3 is a flow diagram for an example of a pipeline using the trained networks of FIG. 1 and FIG. 2 for generating depth images from a 3D model. In an embodiment, pipeline 300 may be implemented by coupling trained noise transfer engine 121 and trained background transfer engine 221 to rendering engine 111, whereby realistic depth images may be generated from any given 3D CAD model 307. The training performed on the GAN of noise transfer engine 121 enables the GAN to learn statistical distribution of the environment for a target object, while the training performed on the GAN of background transfer engine 221 learned statistical distribution of the background for a target object. Accordingly, any 3D CAD model having a target object included in the training of the neural networks for the noise transfer engine 121 and the background transfer engine 221 may be presented to the pipeline 300. The image generation produced at output 325 is enhanced with more accurate depth image information due to the realistic noise and background information supplied by the noise transfer engine 121 and background transfer engine 221. In an embodiment, the rendering engine 111 may include a depth sensor simulation engine 115 to generate simulated 2.5D scans for stacking with corresponding noiseless 2.5D images, each pair forming a 2-channel depth image input to the noise transfer engine 121, which may improve the operation of the neural networks.

Figure 4:
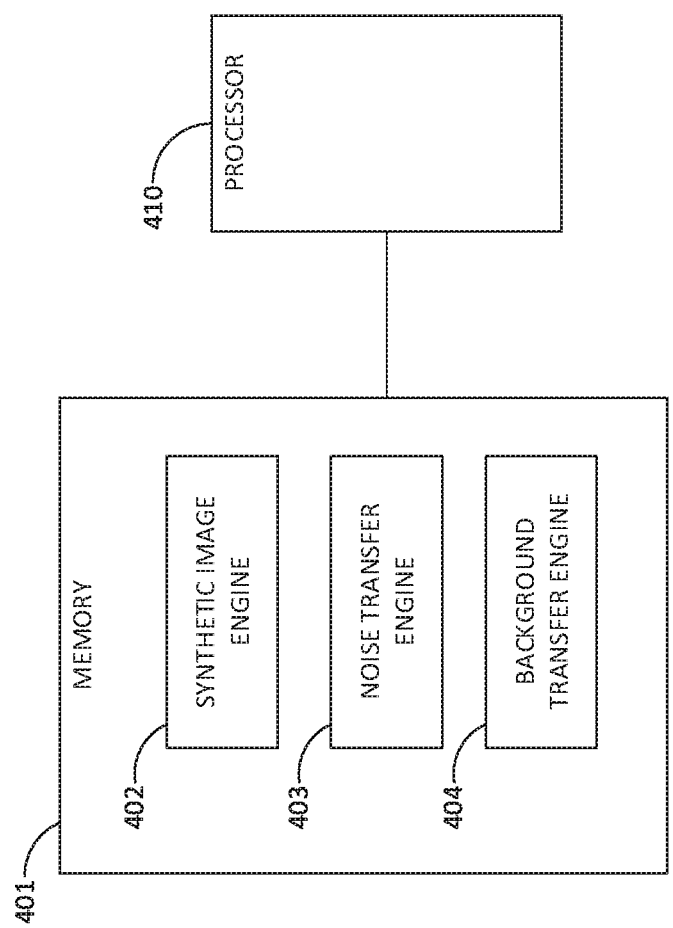
FIG. 4 shows an example of a modular structure for a system to generate realistic depth images in accordance with one or more embodiments of the disclosure.

FIG. 4 shows an example of a modular structure for a system to learn noise and background transfer for synthetic images in accordance with one or more embodiments of the disclosure. Processor 410 may be configured to perform executable instructions stored as program modules in memory 401, which may include various program modules, including a synthetic image engine 402, a noise transfer engine 403, and a background transfer engine 404. In an embodiment, synthetic image engine 402 may include algorithms to generate simulated 2.5D depth images used for machine learning of the noise transfer engine 403, as described above with respect to the training process shown in FIG. 1, whereby the training data enables the noise transfer engine 403 to map synthetic images to corresponding real capture, excluding image backgrounds. The trained noise transfer engine 403 may generate training data for the background transfer engine 404 by processing simulated depth scans from a 3D CAD model to generate enhanced 2.5D depth images without image backgrounds, as described above with respect to the training process shown in FIG. 2. The background transfer engine 404 may be trained to map pseudo-realistic scene backgrounds to the simulated 2.5D depth images without backgrounds. The foreground information of the 2.5D depth images are fixed and cannot be altered by the background transfer engine 404, which forces the background transfer engine to focus only on the background generation. Once the noise transfer engine 403 and background transfer engine 404 are trained, a pipeline may be implemented by the synthetic image engine 402, noise transfer engine 403, and background transfer engine 404 to process simulated images from 3D CAD models to generate realistic depth images without inputs from sensor captures.

Figure 5:
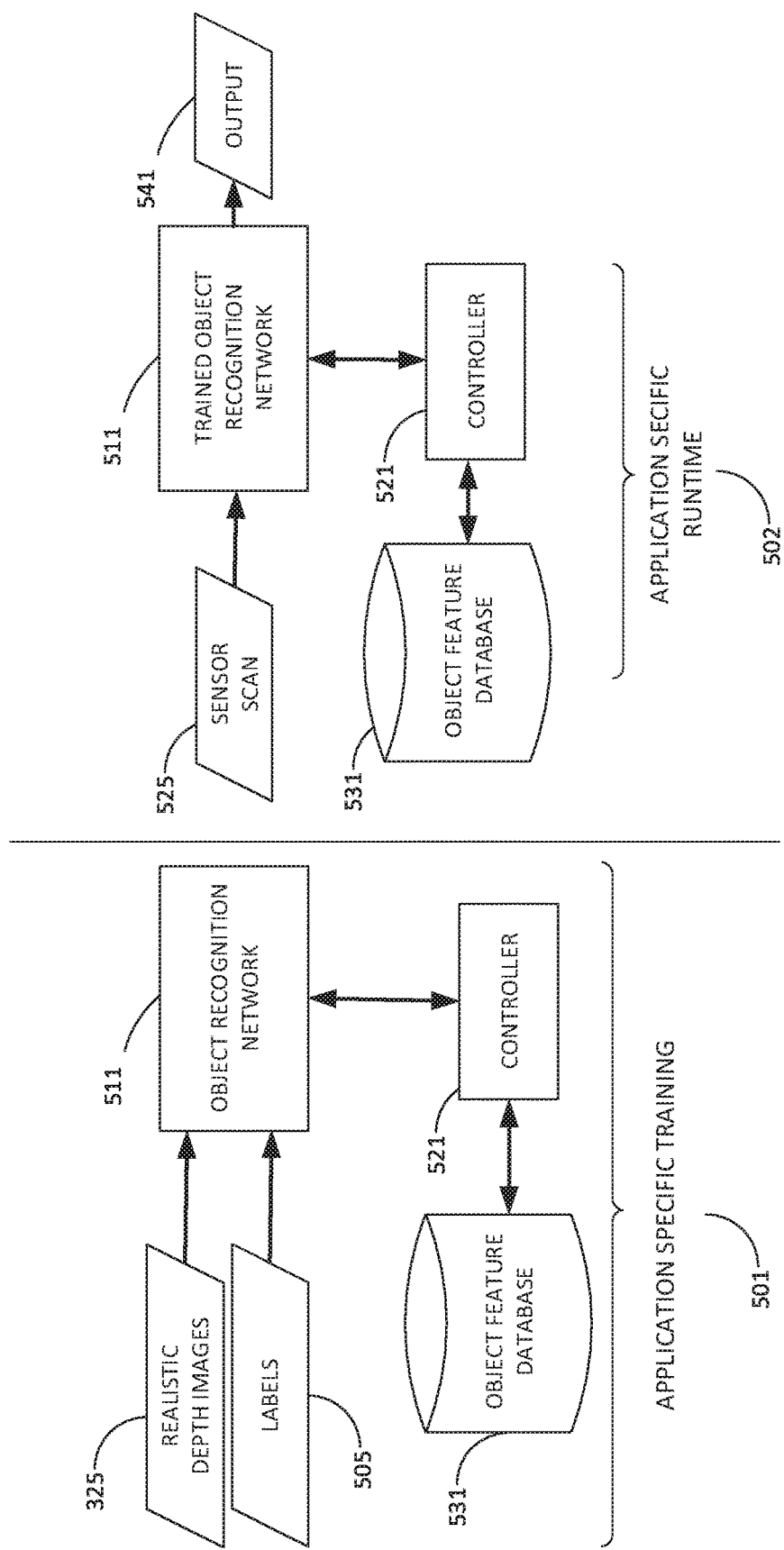
FIG. 5 shows an example of application specific implementation of realistic depth images generated in accordance with one or more embodiments of the disclosure.

FIG. 5 shows an example of object recognition application by a system trained in accordance with one or more embodiments of the disclosure. In an embodiment, the method and system of the present disclosure may generate realistic depth images which may be used as training data for a neural network to learn object recognition. Once trained by the depth images, such an object recognition network may receive a scan or image of an object captured by a sensor device, and identify one or more recognized objects. As shown in FIG. 5, during an application specific training process 501, a controller 521, such as a computer processor, may execute learning algorithms of an object recognition network 511, which accepts inputs of realistic depth images 325 annotated with labels 505. For example, the object recognition network 511 may perform a classification process whereby layers of neural network operate in forward and reverse propagations to learn classifications of objects in the images 325. Learning of object recognition network 511 may also include feature recognition for objects in images 325. Learned features may be mapped to target objects and stored in an object feature database. Following the training process 501, during an application specific runtime process 502, the trained object recognition network 511 may be operated by controller 521 to perform an application specific task, such as object recognition. A sensor scan or image 521 may be fed to the network 511, and based on the training, learned features may be identified from the scan or image 521. The controller 521 may execute a post processing extraction algorithm in network 511 to extract mapping data from the object feature database 531, and identify one or more objects in the sensor scan 525. For example, the controller may match feature representation information, such as rotation and translation vector data mapped to the input scan or image 525, to the object feature database 531 and identify corresponding objects. The object recognition output 541 may be a list of identified objects based searching the component inventory database 531.

Figure 6:
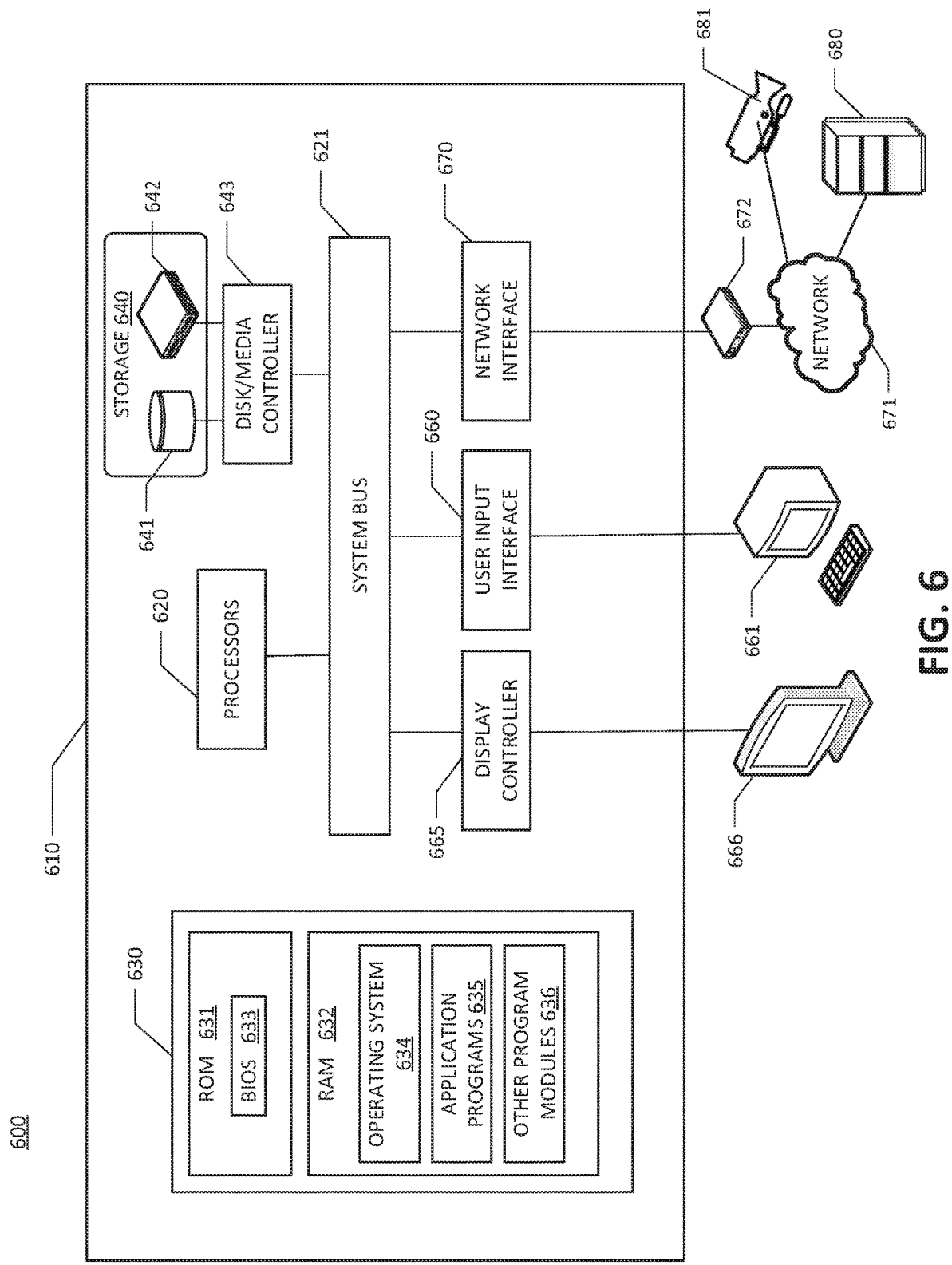
FIG. 6 shows an exemplary computing environment within which embodiments of the disclosure may be implemented.

FIG. 6 shows an exemplary computing environment within which embodiments of the disclosure may be implemented. As shown in FIG. 6, computing environment 600 includes a computer system 610, which may include a communication mechanism such as a system bus 621 or other communication mechanism for communicating information within the computer system 610. The computer system 610 further includes one or more processors 620 coupled with the system bus 621 for processing the information.

The processors 620 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 620 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 621 may include at least one of a system bus, a memory bus, an address bus, or a message bus, and may permit exchange of information (e.g., data (including computer-executable code), signaling, etc.) between various components of the computer system 610. The system bus 621 may include, without limitation, a memory bus or a memory controller, a peripheral bus, an accelerated graphics port, and so forth. The system bus 621 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 6, the computer system 610 may also include a system memory 630 coupled to the system bus 621 for storing information and instructions to be executed by processors 620. The system memory 630 may include computer readable storage media in the form of volatile and/or nonvolatile memory, such as read only memory (ROM) 631 and/or random access memory (RAM) 632. The RAM 632 may include other dynamic storage device(s) (e.g., dynamic RAM, static RAM, and synchronous DRAM). The ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in the ROM 631. RAM 632 may contain data and/or program modules that are immediately accessible to and/or presently being operated on by the processors 620. System memory 630 may additionally include, for example, operating system 634, application programs 635, and other program modules 636.

The operating system 634 may be loaded into the memory 630 and may provide an interface between other application software executing on the computer system 610 and hardware resources of the computer system 610. More specifically, the operating system 634 may include a set of computer-executable instructions for managing hardware resources of the computer system 610 and for providing common services to other application programs (e.g., managing memory allocation among various application programs). In certain example embodiments, the operating system 634 may control execution of one or more of the program modules depicted as being stored in the data storage 640. The operating system 634 may include any operating system now known or which may be developed in the future including, but not limited to, any server operating system, any mainframe operating system, or any other proprietary or non-proprietary operating system.

The application programs 635 may a set of computer-executable instructions for performing synthetic image generation and the training of the noise and background transfer engines for depth scan generation in accordance with embodiments of the disclosure.

The computer system 610 may also include a disk/media controller 643 coupled to the system bus 621 to control one or more storage devices for storing information and instructions, such as a magnetic hard disk 641 and/or a removable media drive 642 (e.g., floppy disk drive, compact disc drive, tape drive, flash drive, and/or solid state drive). Storage devices 640 may be added to the computer system 610 using an appropriate device interface (e.g., a small computer system interface (SCSI), integrated device electronics (IDE), Universal Serial Bus (USB), or FireWire). Storage devices 641, 642 may be external to the computer system 610, and may be used to store image processing data in accordance with the embodiments of the disclosure.

The computer system 610 may also include a display controller 665 coupled to the system bus 621 to control a display or monitor 666, such as a cathode ray tube (CRT) or liquid crystal display (LCD), for displaying information to a computer user. The computer system includes a user input interface 660 and one or more input devices, such as a user terminal 661, which may include a keyboard, touchscreen, tablet and/or a pointing device, for interacting with a computer user and providing information to the processors 620. The display 666 may provide a touch screen interface which allows input to supplement or replace the communication of direction information and command selections by the user terminal device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as the magnetic hard disk 641 or the removable media drive 642. The magnetic hard disk 641 may contain one or more data stores and data files used by embodiments of the present invention. The data store may include, but are not limited to, databases (e.g., relational, object-oriented, etc.), file systems, flat files, distributed data stores in which data is stored on more than one node of a computer network, peer-to-peer network data stores, or the like. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processors 620 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 641 or removable media drive 642. Non-limiting examples of volatile media include dynamic memory, such as system memory 630. Non-limiting examples of transmission media include coaxial cables, copper wire, and fiber optics, including the wires that make up the system bus 621. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The computing environment 600 may further include the computer system 610 operating in a networked environment using logical connections to one or more remote computers, such as remote computing device 680 and one or more image sensor devices 681, such as a depth scanning device (e.g., stereo camera) or the like, that may be used to capture real scan images 103. The network interface 670 may enable communication, for example, with other remote devices 680 or systems and/or the storage devices 641, 642 via the network 671. Remote computing device 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing device 680). The network 671 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

It should be appreciated that the program modules, applications, computer-executable instructions, code, or the like depicted in FIG. 6 as being stored in the system memory 630 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 610, the remote device 680, and/or hosted on other computing device(s) accessible via one or more of the network(s) 671, may be provided to support functionality provided by the program modules, applications, or computer-executable code depicted in FIG. 6 and/or additional or alternate functionality. Further, functionality may be modularized differently such that processing described as being supported collectively by the collection of program modules depicted in FIG. 6 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 6 may be implemented, at least partially, in hardware and/or firmware across any number of devices.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

What is claimed is:

1. A system for generating realistic depth images by enhancing simulated images rendered from a 3D model, comprising:
    at least one storage device storing computer-executable instructions configured as one or more modules; and
    at least one processor configured to access the at least one storage device and execute the instructions,
    wherein the modules comprise:
        a rendering engine configured to render noiseless 2.5D images by rendering various poses with respect to a target 3D CAD model;
        a noise transfer engine configured to apply realistic noise to the noiseless 2.5D images; and
        a background transfer engine configured to add pseudo-realistic scene-dependent backgrounds to the noiseless 2.5D images;
        wherein the noise transfer engine is configured to learn noise transfer based on a mapping, by a first generative adversarial network (GAN), of the noiseless 2.5D images to a real 2.5D scan generated by a targeted sensor;
        wherein the background transfer engine is configured to learn background generation based on a processing, by a second GAN, of output data of the first GAN as input data and the corresponding real 2.5D scan as target data; and
        wherein following training of the first and second GANs, a pipeline is formed by a serial coupling of the first and second GANs for runtime operation to process rendered noiseless 2.5D images generated by the rendering engine to produce realistic depth images.

2. The system of claim 1, wherein learning by the second GAN is refined by processing a dataset of real images from a new target domain to generate backgrounds corresponding with the new target domain.

3. The system of claim 1, wherein the first GAN and the second GAN comprise:
    a discriminator network configured as a deep convolutional network with Leaky rectified linear units and an output defined according to a sigmoid activation function, wherein each activation represents a deduction for a patch of input data.

4. The system of claim 3, wherein the discriminator network of first GAN and the second GAN further comprise:
    a loss function that executes a binary cross entropy evaluation.

5. The system of claim 4, wherein the second GAN comprises a loss function configured to compare a generated image with a target image, the loss function edited to heavily penalize any change to foreground by using input data as a binary mask and a Hadamard product.

6. The system of claim 1, wherein the learning by the noise transfer engine includes cropping backgrounds from images of the real depth scans using the noiseless 2.5D images as masks.

7. The system of claim 1, wherein the modules further comprise:
    a depth sensor simulation engine configured to generate a simulated 2.5D scan for each generated noiseless 2.5D image, wherein the learning by the noise transfer engine includes stacking the simulated 2.5D scan and the noiseless 2.5D image into a 2-channel depth image as an input for the noise transfer engine.

8. The system of claim 1, further comprising:
    an object recognition network configured to process the realistic depth images as training data to learn object classifications for target objects;
    wherein following training of the object recognition network, sensor scans may be processed by the trained object recognition network to correlate features of the sensor scan object features for identification of objects in the sensor scan.

9. A method for generating realistic depth images by enhancing simulated images rendered from a 3D model, comprising:
    rendering noiseless 2.5D images by rendering various poses with respect to a target 3D CAD model;
    applying, by a noise transfer engine, realistic noise to the noiseless 2.5D images; and
    adding, by a background transfer engine, pseudo-realistic scene-dependent backgrounds to the noiseless 2.5D images;
    wherein learning by the noise transfer engine includes a training process based on a mapping, by a first generative adversarial network (GAN), of the noiseless 2.5D images to a real 2.5D scan generated by a targeted sensor;
    wherein learning by the background transfer engine includes a training process based on a processing, by a second GAN, of output data of the first GAN as input data and the corresponding real 2.5D scan as target data; and
    wherein following training of the first and second GANs, forming a pipeline by a serial coupling of the first and second GANs for runtime operation to process rendered noiseless 2.5D images generated by the rendering engine to produce realistic depth images.

10. The method of claim 9, wherein learning by the second GAN is refined by processing a dataset of real images from a new target domain to generate backgrounds corresponding with the new target domain.

11. The method of claim 9, wherein the first GAN and the second GAN comprise:
   a discriminator network configured as a deep convolutional network with Leaky rectified linear units and an output defined according to a sigmoid activation function, wherein each activation represents a deduction for a patch of input data.

12. The method of claim 11, wherein the discriminator network of first GAN and the second GAN further comprise:
   a loss function that executes a binary cross entropy evaluation.

13. The method of claim 12, wherein the second GAN comprises a loss function configured to compare a generated image with a target image, the loss function edited to heavily penalize any change to foreground by using input data as a binary mask and a Hadamard product.

14. The method of claim 9, wherein the learning by the noise transfer engine includes cropping backgrounds from images of the real depth scans using the noiseless 2.5D images as masks.

15. The method of claim 9, further comprising:
   generating, by a depth sensor simulation engine, a simulated 2.5D scan for each generated noiseless 2.5D image, wherein the learning by the noise transfer engine includes stacking the simulated 2.5D scan and the noiseless 2.5D image into a 2-channel depth image as an input for the noise transfer engine.

* * * * *